United States Patent [19]

Hübner et al.

[11] 4,411,483

[45] Oct. 25, 1983

[54] FRAME FOR PC-BOARDS

[75] Inventors: Rudolf Hübner; Rolf Grabenhorst, both of Bremen, Fed. Rep. of Germany

[73] Assignee: Vereinigte Flugtechnische Werke GmbH, Bremen, Fed. Rep. of Germany

[21] Appl. No.: 253,873

[22] Filed: Apr. 13, 1981

[30] Foreign Application Priority Data

Apr. 14, 1980 [DE] Fed. Rep. of Germany ... 8010147[U]

[51] Int. Cl.³ .............................................. H05K 5/00
[52] U.S. Cl. .................................. 339/17 M; 361/415
[58] Field of Search ............... 361/415, 416; 339/198, 339/17 C, 17 M; 211/41, 17 C, 17 M

[56] References Cited

U.S. PATENT DOCUMENTS 3,280,377 10/1966 Harris et al. ......................... 361/415
4,158,876 1/1979 Pedro ................................. 361/415

Primary Examiner—Eugene F. Desmond
Assistant Examiner—David Pirlot
Attorney, Agent, or Firm—Ralf H. Siegemund

[57] ABSTRACT

A drawer-like frame has an open bottom which is provided with a lattice-kind construction of transverse bars extending from one wall to the opposite wall (e.g., a partition) and an elongated mounting plate across the transverse bars. Terminal elements have one of their ends bolted to such a mounting plate and the other end is bolted to a mounting bar at one of the walls.

5 Claims, 1 Drawing Figure

U.S. Patent    Oct. 25, 1983    4,411,483
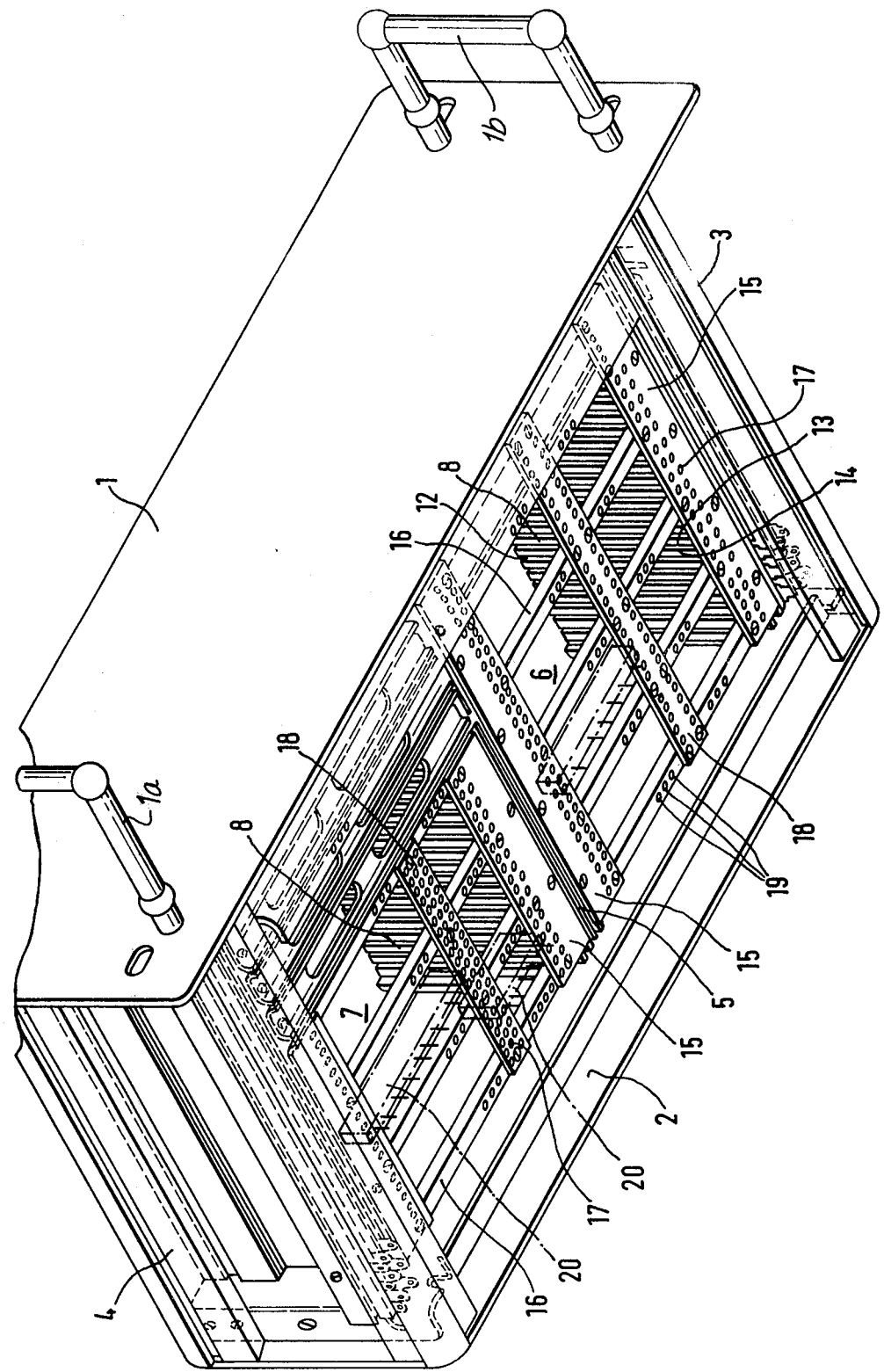

FRAME FOR PC-BOARDS

BACKGROUND OF THE INVENTION

The present invention relates to a frame for printed circuit boards, being, for example, of the type in which rails are provided in opposite-facing pairs, for holding a board in a particular position.

It is a practice of long standing in the electronics, communications, and computer arts to use racks, cabinets, or the like, for the placement of, e.g., drawer-like frames in which printed circuit boards are mounted. Walls and/or partitions of and in such a frame are, for example, provided with mutually facing rail pairs for insertion of PC-boards. Also, connector or plug-in type terminals are provided for effecting an electrical connection. These terminals are, for example, longitudinal blocks, constructed on one side with a socket to receive a PC-board, while terminal pins extend from the opposite side. Backwiring, or the like, provides for additional connection of these terminal pins.

In the past, these frames were constructed for accommodating one kind and type (i.e., length) for such terminal elements. Whenever terminal elements or blocks of different dimensions were to be used, special steps had to be taken in order to permit their use. This is, basically, a rather undesirable approach.

DESCRIPTION OF THE INVENTION

It is an object of the present invention to provide a new and improved drawer-like mounting frame for PC-boards which can be used for different (i.e., differently long) terminals.

In accordance with the preferred embodiment of the present invention, it is suggested to construct such a frame with an open bottom; and mounting bars are affixed near that bottom along the side walls and partitions, if any; transverse bars are fastened to these mounting bars extending across the bottom and having a plurality of preferably centrally located and preferably threaded bores or apertures; elongated mounting plates with threaded bores are fastened to these adjustable transverse bars at correspondingly adjustable spacings from the walls, and extending parallel to the mounting bars. Terminal elements are fastened with one end to one of the mounting bars, thus extending parallel to the transverse bars. The distances and spacings of the mounting plates to their respective mounting bars are adjusted to the lengths of the terminal elements. Fastening can in all instances be accomplished simply by bolting, or otherwise.

It can, thus, be seen that the basically open bottom of the frame is spanned by transverse bars and elongated plates, forming a kind of lattice structure which, however, does not have to be a regular one but may vary locally to accommodate differently long terminal elements. The side walls and partitions are preferably lined with covers which have grooves into which the PC-boards are inserted so that their contacts will be inserted into the terminal elements which are fastened as described.

DESCRIPTION OF THE DRAWINGS

While the specification concludes with claims, particularly pointing out and distinctly claiming the subject matter which is regarded as the invention, it is believed that the invention, the objects and features of the invention, and further objects, features and advantages thereof, will be better understood from the following description taken in connection with the accompanying drawings, in which:

The FIGURE is an isometric view and from below a frame/drawer in accordance with the preferred embodiment of the present invention for practicing the best mode thereof.

Proceeding now to the detailed description, the FIGURE shows a drawer-like frame having a front 1 and handles 1a and 1b, a rear wall 2, and side walls 3 and 4. One can also say that spaced-apart walls 3 and 4 are interconnected by joining walls 1 and 2, thereby defining the frame. The bottom of the frame is basically of an open construction. In addition, a central partitioning wall 5 is provided, extending parallel to the side walls. Depending upon the length of the frame, more than one partition, or none, may be provided. Presently, the single partition divides the interior mounting space of the frame into two portions, 6 and 7.

The two surfaces of partition 5 as well as the inwardly facing surfaces of the two side walls 3 and 5 are each covered with a lining 8 made of a synthetic material. These linings 8 are provided with vertical grooves 12, extending over the entire height of such a lining. Each one of such grooves has two edges, 13 and 14, which serve as guide and positioning rails for printed circuit boards to be inserted. The PC-boards will, thus, extend transversely to the walls and partitions.

Longitudinal mounting bars 15 are bolted or otherwise fastened to the side walls 3 and 4 near the bottom, as well as on both sides of partition 5. One may say that these bars 15 establish a mounting plane across the bottom of the two spaces 6 and 7.

These flat bars 15 are provided with threaded bores 17 arranged, e.g., in two rows for fastening of the cross-bars or transverse bars 16. The central portions of these cross-bars, in turn, are provided with a row of threaded bores 19. These bores establish, in pairs, particular positions on the cross-bars. Cross-plates, i.e., elongated mounting plates 18, are bolted to the cross-bars 16 as illustrated. The grouping of bores 19 permits the relative position of these cross-plates 18 to be adjusted toward partition 5 or one of the side walls 3 or 4, as the case may be. Normally, a plate may be held in the middle in between the partition and one of the side walls, as shown in the right-hand portion of the FIGURE. The left-hand portion shows a plate 18 closer to partition 5 than to wall 4.

The FIGURE shows also two examples for terminal plug and socket elements 20 and 20', which are differently long, and one end of each terminal element is bolted to a mounting plate 18 while its other end is bolted to one of the plates 15.

It can also be seen that differently long plates 18 can be used for spanning a portion of the bottom width of a mounting space (6 or 7), while another portion is bridged by a differently located plate 18, so that differently long terminal bars can be accommodated. The essence of the construction is to span the open bottom of the drawer/frame with a lattice kind of mounting structure, not necessarily a regular one so that different terminal elements can be mounted and in alignment with grooves (12) to make it possible that a PC-board, when inserted, can be plugged into its respective terminal element.

The invention is not limited to the embodiments described above; but all changes and modifications thereof, not constituting departures from the spirit and scope of the invention, are intended to be included.

We claim:

1. A drawer-like frame for mounting printed circuit boards and terminal elements for such boards and having at least two walls facing each other across a mounting space and additional joining walls completing the frame having an open bottom, a mounting structure, comprising:

mounting bars disposed on the walls and near the open bottom of the frame;

a plurality of transverse bars fastened to the mounting bars, extending across said bottom laterally spaced from the joining walls and having a plurality of bores extending transversely to the bottom of the frame; and at least one longitudinal mounting plate having bores likewise extending transversely to the bottom of the frame, said plate having been mounted on said transverse bars while extending parallel to said mounting bars on the walls, said mounting plate being provided for mounting terminal elements in that such a terminal element extends parallel to the transverse bars but is fastened with one end to said mounting plate, and with its other end to one of said mounting bars on one of the walls.

2. A frame as in claim 1, said mounting bars and said mounting plate being provided with threaded bores for bolting of terminal elements.

3. A frame as in claim 1 or 2, there being two side walls and at least one partition wall, and two mounting plates accordingly, along the partition wall and in coplanar relation to each other.

4. A frame as in claim 3, at least one of the two mounting plates having a larger distance from the respective walls between which it extends than the other one.

5. A frame as in claim 1, the walls being lined with a synthetic cover having grooves for inserting circuit boards.

* * * * *